United States Patent
Venkatesh et al.

(10) Patent No.: US 7,386,074 B1
(45) Date of Patent: Jun. 10, 2008

(54) DIGITAL AUTOMATIC GAIN CONTROL METHOD AND APPARATUS

(75) Inventors: Narasimhan Venkatesh, Hyderabad (IN); Satya Rao, Hyderabad (IN); Dharani Naga Sailaja Sankabathula, San Jose, CA (US); Partha Sarathy Murali, Hyderabad (IN)

(73) Assignee: RedPine Signals, Inc., San Jose, CA (US)

( * ) Notice: Subject to any disclaimer, the term of this patent is extended or adjusted under 35 U.S.C. 154(b) by 688 days.

(21) Appl. No.: 10/680,620

(22) Filed: Oct. 6, 2003

(51) Int. Cl.
*H04L 27/08* (2006.01)

(52) U.S. Cl. .................. 375/345; 455/234.1

(58) Field of Classification Search ........ 375/345; 455/232.1, 234.1, 245.1; 341/139; 330/254, 330/278
See application file for complete search history.

(56) References Cited

U.S. PATENT DOCUMENTS

| | | | |
|---|---|---|---|
| 3,983,381 A | 9/1976 | Jones | |
| 4,191,995 A | 3/1980 | Farrow | |
| 4,482,973 A | 11/1984 | Unagami et al. | |
| 4,747,065 A | 5/1988 | West | |
| 4,774,474 A | 9/1988 | Beauducel et al. | |
| 4,807,167 A | 2/1989 | Green | |
| 4,989,074 A | 1/1991 | Matsumoto | |
| 5,083,304 A | 1/1992 | Cahill | |
| 5,117,201 A | 5/1992 | Luther | |
| 5,206,647 A * | 4/1993 | Stone | 341/139 |
| 5,235,424 A * | 8/1993 | Wagner et al. | 455/245.1 |
| 5,276,685 A | 1/1994 | Kepler et al. | |
| 5,301,364 A | 4/1994 | Arens et al. | |
| 5,451,948 A | 9/1995 | Jekel | |
| 5,469,115 A | 11/1995 | Peterzell et al. | |
| 5,680,075 A | 10/1997 | Sacca | |
| 5,706,217 A | 1/1998 | Genrich | |
| 5,917,865 A | 6/1999 | Kopmeiners et al. | |
| 6,026,131 A * | 2/2000 | Laurent et al. | 375/345 |
| 6,122,331 A | 9/2000 | Dumas | |
| 6,292,120 B1 * | 9/2001 | Painchaud et al. | 341/139 |
| 6,510,188 B1 * | 1/2003 | Isaksen et al. | 375/345 |
| 6,553,084 B1 * | 4/2003 | Maru | 375/345 |
| 6,560,448 B1 | 5/2003 | Baldwin et al. | |
| 6,574,292 B2 * | 6/2003 | Heinonen et al. | 375/345 |
| 6,754,195 B2 | 6/2004 | Webster et al. | |
| 6,760,386 B2 | 7/2004 | Li et al. | |
| 6,763,228 B2 | 7/2004 | Prentice et al. | |
| 6,785,523 B2 | 8/2004 | Husted et al. | |
| 6,795,694 B2 | 9/2004 | Uesugi | |

\* cited by examiner

*Primary Examiner*—Betsy L Deppe
(74) *Attorney, Agent, or Firm*—File-EE-Patents.com; Jay A. Chesavage

(57) ABSTRACT

An RF receiver which produces quadrature digitized outputs and has a gain control is coupled to a digital gain controller which converts the quadrature digitized outputs into an rms voltage, and iterates over a finite number of steps to quickly control the gain to a level sufficient to achieve subsequent digital signal processing without limitations caused by insufficient dynamic range or nonlinear saturation effects caused by insufficient signal or excessive signal at the A/D input, respectively.

47 Claims, 7 Drawing Sheets

DIGITAL AUTOMATIC GAIN CONTROL METHOD AND APPARATUS

FIELD OF THE INVENTION

This invention relates to the control of a wireless RF front end comprising mixers and amplifiers, where the RF front end, also known as an RF receiver, has a gain control input and the RF receiver produces a baseband output which is sampled by an A/D converter. The invention specifically relates to a method and apparatus for controlling the RF receiver gain by using the baseband output A/D converter outputs.

BACKGROUND OF THE INVENTION

RF amplifiers, mixers, and baseband converters are well known in the art of high frequency signal processing. One of the characteristics of an RF receiver is gain control, and one of the limitations of the output of an RF receiver is saturation, whereby the signal level is amplified beyond the linear region of operation of the amplifier. Typically, in an RF receiver, each successive stage generates signal gain, and in a digital signal processing system which accepts as input the A/D outputs of the RF receiver. For best noise performance, each stage has a gain characteristic which exceeds its noise contribution, so that in well-designed systems, it is usually the last stage of the amplifier chain which saturates from excessive gain for a given input signal level. For a digital system, this last stage is the A/D converter, and it is possible to measure the signal level generated by the A/D converter and determine whether to increase or decrease the gain of the system. For a wireless communications system operating under the IEEE 802.11 series of standards, it is further desired to make gain adjustments during the initial stage of the packet known as the preamble.

FIG. 1 shows an IEEE 802.11 wireless Ethernet packet 10. The IEEE standards have provided an initial set of specifications for 802.11, and subsequent revisions to the specification have added, and continue to add additional standards, which are reflected in a suffix letter. The group of standards having the 802 prefix are known collectively as Ethernet standards. Currently approved IEEE standards for wireless communications are IEEE 802.11, IEEE 802.11a, IEEE 802.11b, IEEE 802.11g, and others are in development. In the present invention, we will refer to the entire body of current and future IEEE 802.11 standards simply as 802.11. The wireless packet 10 comprises a preamble 12 which has a preamble time T1 16, and is followed by the data frame 14 which occupies a data time T2 18. The communications system receiving this packet has the duration of the preamble T1 16 to accomplish synchronization and set the gain control. For 802.11b T1=15 us, and for 802.11a T1=6 us. Prior art Automatic Gain Control (AGC) systems typically accommodate slow changes in AGC level over long intervals of time. In 802.11 wireless communications, the distinction is that the information arrives in discrete packets from different transmitter sources, and each packet may require its own AGC level.

FIG. 2a shows a prior art RF receiver, as might be used in an 802.11 wireless system. This type of system is known as a dual conversion receiver, and comprises an antenna 22 for receiving incoming signals, an RF receiver 20 for processing and baseband converting these signals into a quadrature pair of signals 21 and 23, and analog to digital (A/D) converters 24 and 26 for converting these signals into a pair of quadrature digital outputs 25 and 27, each with a data width Ndata. There are several signal processing methods for realizing an RF receiver, and prior art FIG. 2a shows a dual conversion receiver. Incoming signals are amplified by preamp 28, which has a gain control input for receiving an analog signal from a D/A converter 29, which produces this gain control signal from a digital preamplifier gain port 50. This gain control input 50 causes a varying amount of gain to be generated by preamplifier 28, which delivers the amplified signal to a mixer 30, which frequency converts the RF signal to an intermediate frequency (IF) with the use of a first local oscillator 32. An IF filter 34 removes the unwanted image frequencies, and the IF amplifier 36 amplifies the IF signals and provides them to a pair of mixers 38 and 42. Quadrature local oscillators 40 and 44 produce a pair of baseband detection signals which are phase coherent single frequency signals separated in phase by 90 degrees. These quadrature signals are provided to the mixers 38 and 42, and low pass filters 46 and 48 remove all but the quadrature baseband signals 21 and 23, which is suitable for conversion with A/D converters 24 and 26. In a typical RF system, preamplifier 28 has a small amount of gain control, and IF amplifier 36 has a larger amount of gain control. The characteristic of gain control is often exponential with applied voltage, producing a gain/control characteristic of db/volt. An RF receiver where the gain control has the characteristic of increasing gain with increased control is known as a "positive gain control amplifier", and an RF receiver where the gain decreases with increased control is known as a "negative gain control amplifier".

FIG. 2b shows a prior art direct-conversion RF receiver 60. Signals from an antenna 62 are delivered to the RF receiver 60, and are applied to variable gain preamplifier 64, as before. The amplified signals are applied directly to a quadrature detector comprising a pair of mixers 68 and 72, which are driven by quadrature local oscillators 70 and 74. Matched low pass filters 76 and 78 produce signals for the A/D converters 80 and 82, which simultaneously sample the signals to produce I (in-phase) 81 and Q (quadrature) 83 digital signals, each with a word size of Ndata. Gain control port 66 operates as before, where a digital signal is sent through a D/A converter to produce a control signal for preamplifier 64.

FIG. 3 shows the nature of gain control for an exemplar system. An arbitrary signal level is applied to the antenna of the systems of either FIG. 2a or 2b, and produces an output at the A/D converter. For optimal performance, sufficient gain control should be applied to the RF receiver to move the signal to the range noted as optimal RMS (Root Mean Square) level 91, which corresponds to an "optimum gain control input range" 90. This is accomplished by applying the suitable level of gain control to achieve the optimum RMS input level 91, which depends on whether the amplifier has a positive gain control characteristic 92, or a negative gain control characteristic 94, as well as the sensitivity and saturation characteristic of the gain curve. A digital gain control input Vagc 96 is applied which exponentially changes the gain according to 92 or 94, and the gain control range 90 which causes the A/D to receive optimum RMS voltage levels is the desired gain control range 90. This level must be reached during time T1 of FIG. 1, while still allowing enough time for system synchronization to occur on the preamble 12.

It is desired to have an AGC apparatus and method for an RF receiver having a gain control and digitized outputs which acts upon the digitized outputs and provides the gain control signal to quickly bring the gain of the RF receiver to a level sufficient to allow subsequent signal processing. It is further desired for the AGC apparatus and method to settle to a usable level of gain during the time of reception of the preamble of the wireless packet.

OBJECTS OF THE INVENTION

A first object of the invention is an apparatus for controlling the gain of an RF front end using a binary approximation based on rms voltage at the output of the RF front end.

A second object of the invention is a method for controlling the gain of an RF front end using a binary approximation based on rms voltage at the output of the RF front end.

SUMMARY OF THE INVENTION

A gain control known as Vagc and having n bits of control is set to an initial value $2^{(n-1)}-1$. Thereafter, an iteration variable k is initialized to allow m iterations to occur. On each iteration, the digitized outputs of the quadrature channels of the RF receiver are sampled and Vrms is computed. The value of Vrms is compared to a threshold value, and if Vrms is greater than the threshold value, a value $2^{n-k-1}$ is subtracted from Vagc, and if Vrms is less than the threshold value, this value $2^{n-k-1}$ is added to Vagc. The initialization and iteration steps described is performed during the preamble time of a data packet.

DETAILED DESCRIPTION OF THE INVENTION

Figure 2A:
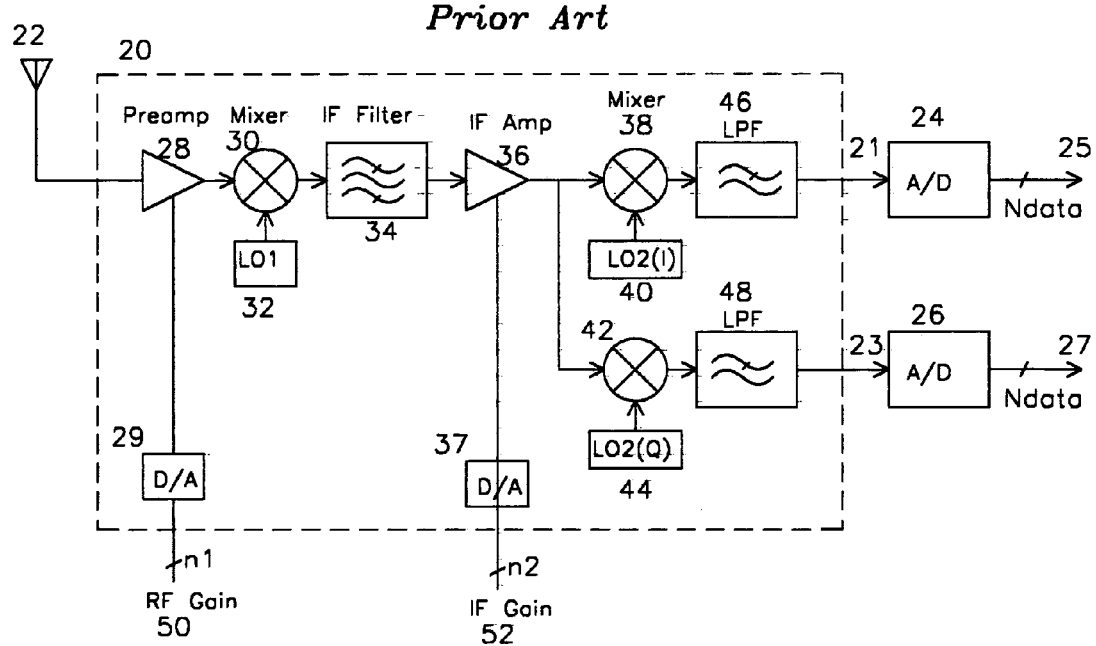
FIG. 2a shows the block diagram of a prior art heterodyne RF receiver.
Figure 2B:
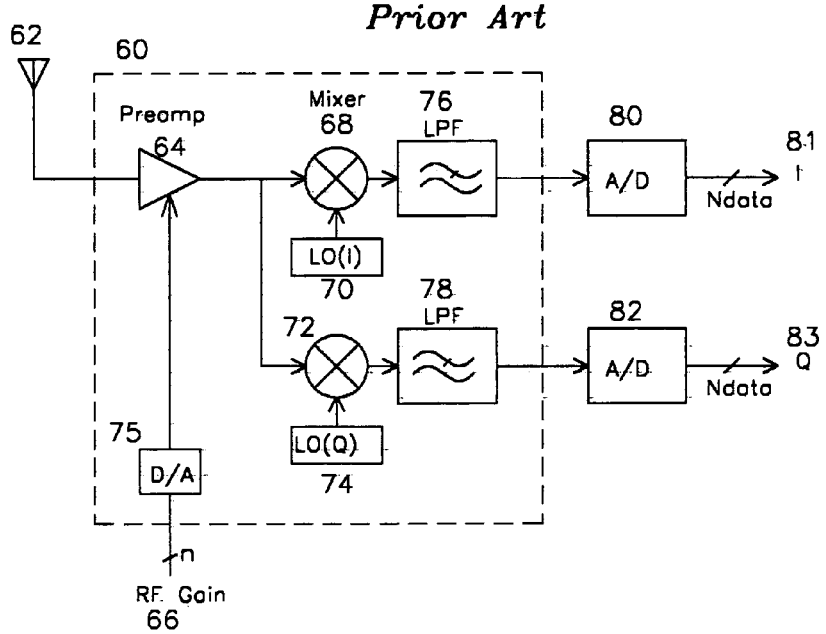
FIG. 2b shows the block diagram of a prior art direct conversion RF receiver.
Figure 4:
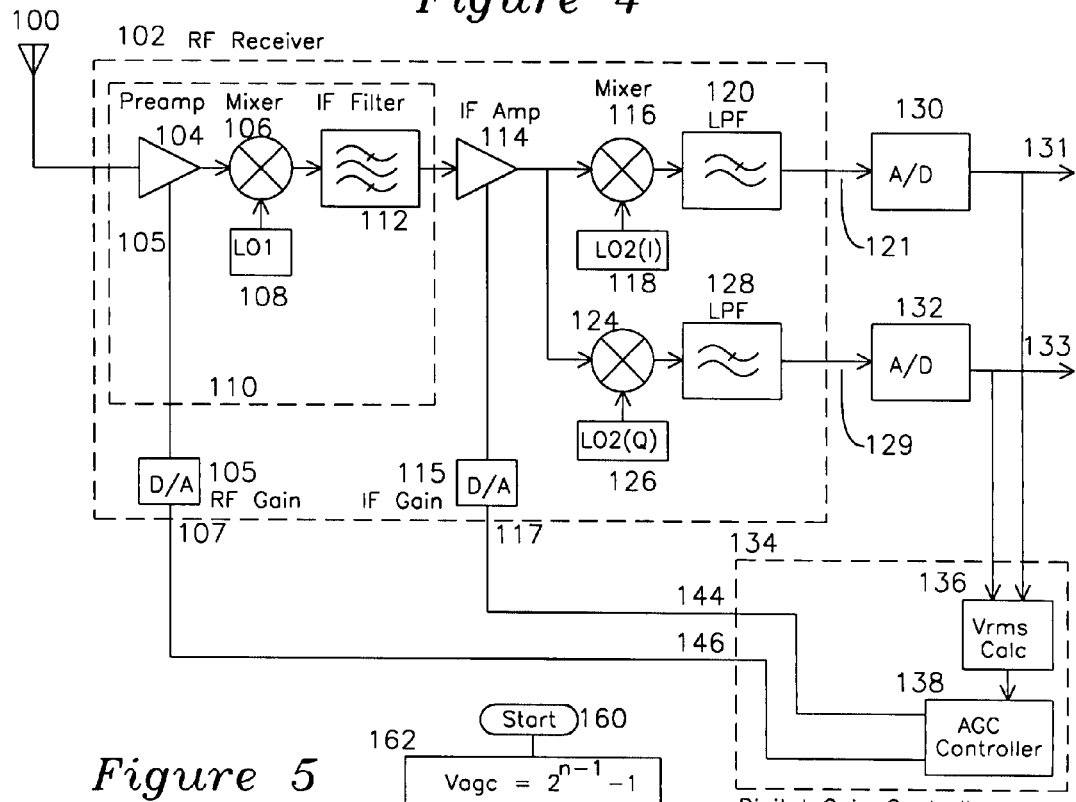
FIG. 4 shows the block diagram of an RF receiver with a digital AGC controller.

FIG. 4 shows an antenna 100 coupled to a prior art receiver 102 with a digital AGC controller 134. The operation of the RF receiver 102 is identical to either the heterodyne receiver 20 of FIG. 2a, or the direct conversion receiver 60 of FIG. 2b.

For a heterodyne receiver, the antenna 100 signal is applied to a preamplifier 104 having a digital gain control input 107 which converts the digital gain control to an analog voltage to control the adjustable gain preamplifier 104. The amplified signal is applied to a mixer 106, and mixed with the output of a local oscillator 108 which is offset from the center frequency of the wireless signal by an intermediate frequency (IF). The mixer 106 generates a signal at this IF which is passed on to the IF filter 112 and variable gain IF amplifier 114 having a gain control input 117 which produces a gain control signal for IF amplifier 114 with D/A converter 115. The IF amplifier 114 applies the amplified signals to the quadrature mixers 116 and 124, where quadrature oscillators 118 and 126 are in quadrature at the IF frequency, causing the signal to be mixed down to quadrature baseband. Low pass filters 120 and 128 remove image frequencies, and generate analog quadrature baseband outputs 121 and 129, followed by conversion to digital quadrature signals 131 and 133 by A/D converters 130 and 132. Digital gain controller 134 inputs the digital quadrature signals 131 and 133 having data width Ndata, and rms voltage calculator 136 produces an estimate of the rms signal level. The rms signal level is passed to agc controller 138, which produces one or more digital outputs 144 and 146, which are applied to the gain controls of the RF front end 102.

Figure 3:
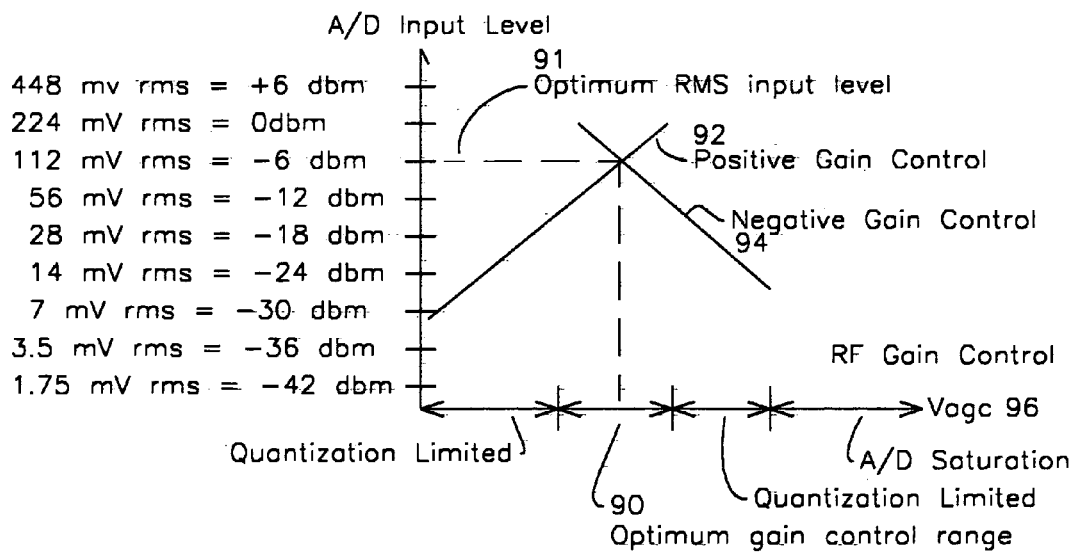
FIG. 3 shows a plot of the A/D sampled output and Vagc control characteristics for an amplifier with positive gain control and an amplifier with negative gain control.

When the RF receiver 102 is a direct conversion receiver, the IF functions 110 are deleted. The antenna 100 is coupled to an RF amplifier 114 which a gain control input 117, which converts the incoming digital control signal 117 to an analog control voltage to amplifier 114. The output of amplifier 114 is applied to quadrature mixers 116 and 124, and the quadrature local oscillators 118 and 126 produce signals which are 90 degrees out of phase with each other, and at the same frequency as the incoming signal to be detected. The output of these mixers is passed through low pass filters 120 and 128 producing baseband quadrature signals 121 and 129, and sampled by A/D converters 130 and 132 to produce quadrature signals 131 and 133. Whether direct conversion or IF conversion, the RF receiver has an applied gain control 117 and optionally 107, with the principal requirement remaining that gain increases or decreases monotonically with increasing gain control, as shown in FIG. 3. This may be accomplished by making the most significant bits of the gain control word Vagc control the RF amplifier 104, if present, and the remaining bits of Vagc control the IF amplifier 114.

Figure 5:
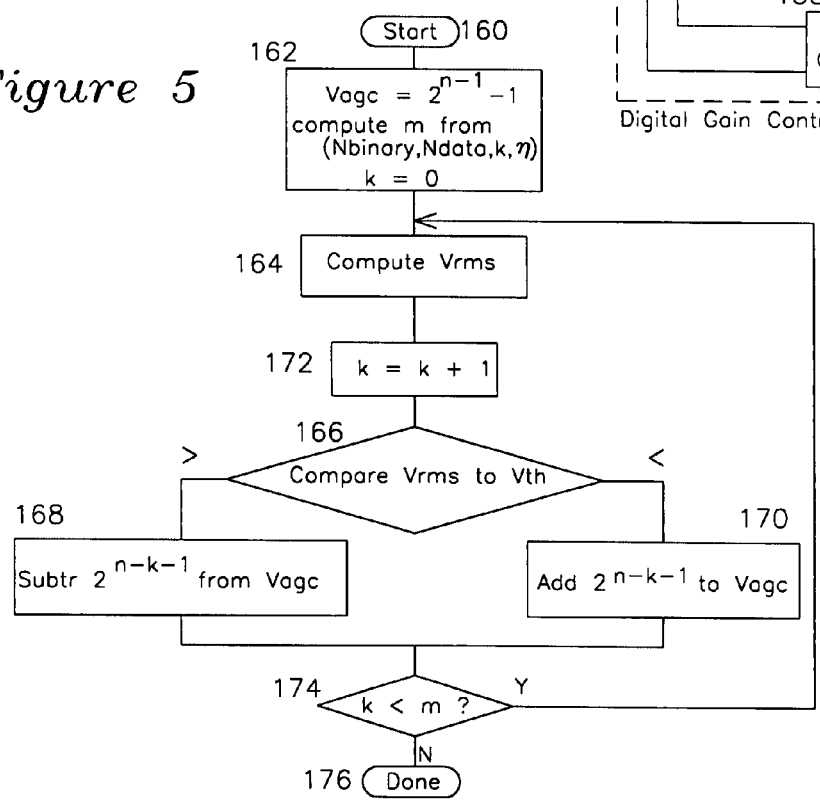
FIG. 5 shows a flowchart for a digital AGC controller.

FIG. 5 shows the digital AGC algorithm as it applies to FIG. 4. FIG. 4 shows an digital gain controller 134 whereby in-phase and quadrature RF signals 131 and 133 are applied to an rms voltage calculator 136. The AGC controller 138 acts on the rms voltage computed by 136, and implements a binary search algorithm to control gain, according to the method describe below. Certain variables and constants are used by the program, and are defined below. A variable represents a value which changes during the execution of the algorithm, and a constant maintains its value during the execution of the algorithm, however different values for a given constant may be used at different times.

Vagc is a variable and is the gain control word which is applied to the gain control inputs of an RF front end, such as inputs 107 and 117 of FIG. 4.

n is a constant and is the size of the gain control word Vagc in bits.

m is a constant and represents the number of iterations to be performed by the gain control algorithm, and is presently fixed at 4.

k is a variable representing the number of iterations of the loop that have been run.

Vth is a threshold value for which the A/D converter operates optimally. If the A/D converter receives a very small input signal, the dynamic range of the A/D converter is wasted, and the output is confined to a smaller number of bits. For example, if a 12 bit A/D converter with a maximum scale of 1V peak is presented with a signal peak level which is never greater than 36 db below this 1V level (corresponding to 16 mv peak), only a 6 bit word of the 12 bit output will be presented at the outputs, and an additional 36 db of path attenuation will cause the system to stop receiving words at all. On the other extreme, if the input level exceeds the maximum level of the A/D, the converter will saturate, and the system will cease to perform as a linear system, which is required for most of the subsequent signal processing such as digital filters and detectors.

Figure 6:
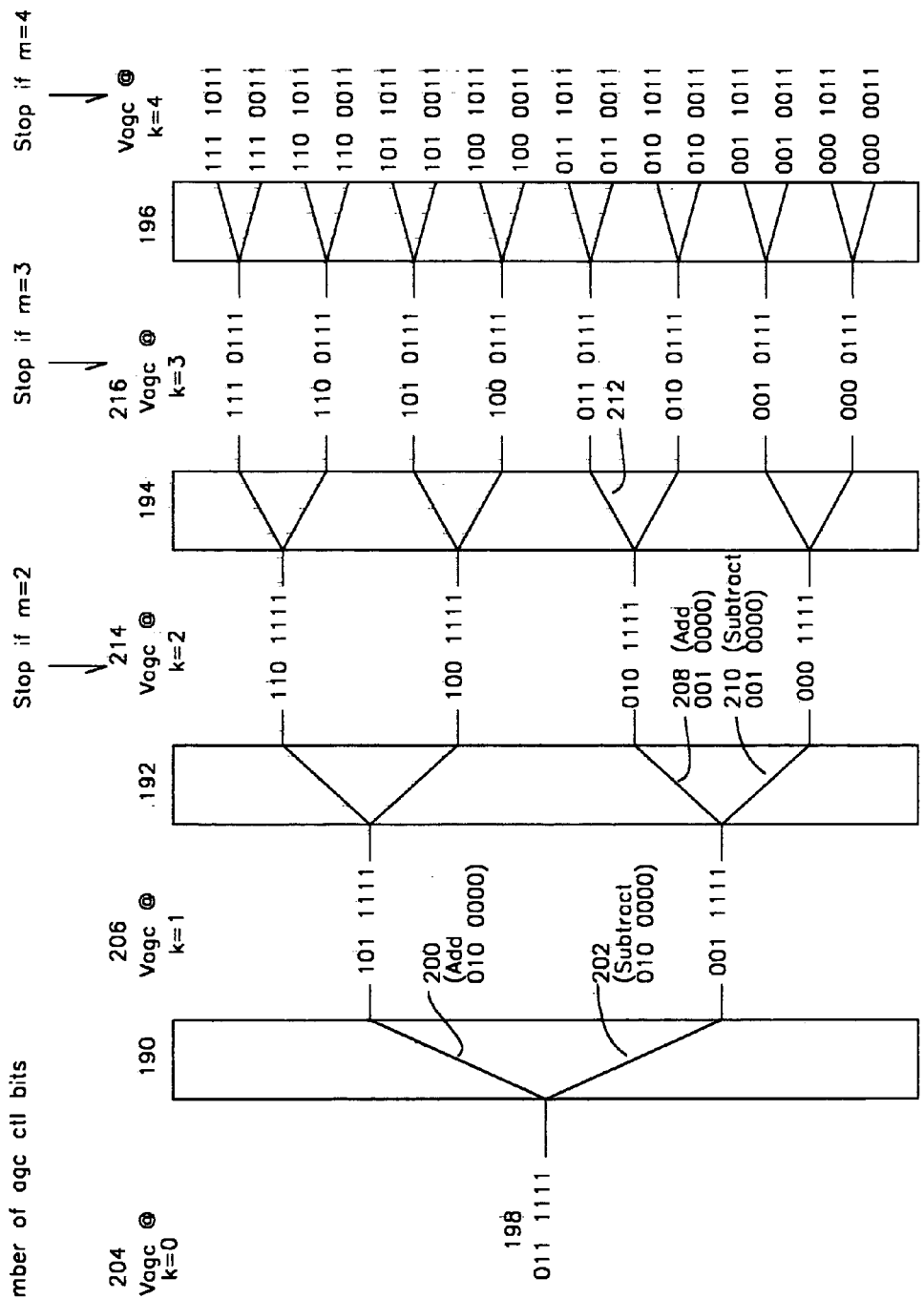
FIG. 6 shows a diagram of a binary tree for the digital AGC controller.

The algorithm is described in FIG. 5, and may be understood in combination with FIG. 6, which shows the binary tree associated with the execution of the algorithm for the case where the data size of Vagc n=7. Execution of the algorithm starts at step 160, and initialization occurs at step 162 with Vagc being initialized to the value $2^{n-1}-1$, and the loop variable k set to 0 and the number of iterations m optionally pre-computed from system constants, as will be described later. FIG. 6 illustrates this with initial value 011 1111 198 and k=0 204. FIG. 5 step 164 presents the value of Vrms for the new gain setting, corresponding to Vrms calculator 136 of FIG. 4. In step 166, the rms voltage from the output of the A/D converters is compared to a threshold voltage Vth. The origins of Vth will be described in FIG. 9, but relate to the optimum control range for the A/D converter. If the input level Vrms is greater than Vth, the gain needs to be lowered in step 168, and if the input level is less than Vth, the gain needs to be increased in step 170. The amount of gain control change in each iteration is $2^{n-k-1}$ as shown in steps 168 and 170 of FIG. 5 and successive correction values 200, 202, 208, and 210 of FIG. 6, corresponding to roughly half of each gain control step. In each iteration, the iteration variable k is incremented in step 172 prior to its application in steps 160 or 170, and the number of iterations is compared to the number of iterations of the loop in step 174. If the number of iterations k is less than the number required m, the program returns to step 164, and if the number of iterations is complete, the program completes in step 176. Viewing FIG. 6, where the case for n=7 is described, the initial value 011 1111 198 is set and k is initialized to 0 204. 190 shows the result of the decision point where the value 010 0000 is added 200, or it is subtracted 202, and the loop variable k is incremented to 1 206. On the following iteration, k=2 214, and upon comparison of Vrms to Vth, the value 001 0000 is added 208 or subtracted 210, as shown. The process continues for each iteration as shown, until the chosen number of iterations is reached, as measured by the value of iteration variable k.

The flowchart of FIG. 5 illustrates the case where RF receiver 102 of FIG. 4 has gain control 107 or 117 which is positive gain control as described in FIG. 3, such that the gain of amplifiers 104 or 114 increases with increasing control 107 or 117, respectively. It is possible that the gain characteristics of these is opposite, such that increased gain control 107 or 115 produces decreased gain in amplifiers 104 or 114, respectively. The result of comparison step 166 in combination with incrementing iteration variable k is to add 170 or subtract 168 a value which is half of the previously added or subtracted value and changes the gain in the direction that is required: if the measured signal Vrms exceeds the threshold Vth, the front end 102 gain must be reduced, and if the threshold signal Vth exceeds the measured signal Vrms, the front end gain 102 gain must be increased.

Figure 1:
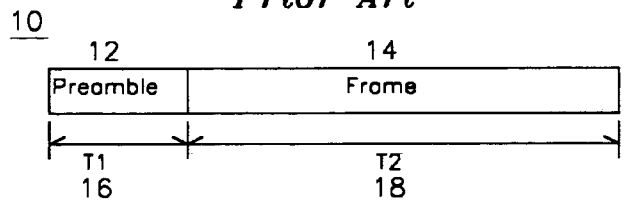
FIG. 1 shows a prior art 802.11 wireless packet.

As was described earlier, each iteration k through the process requires a certain settling time for the gain control to take effect, and it is desired to limit the number of iterations through the gain control loop such that the gain control is completed during the preamble 12 time T1 16 of FIG. 1. It is often found that only 3 or 4 iterations is necessary for the system to have a usable gain level for an 802.11 system processing packets of data. The application of gain control may be considered to occur in two periods with different control objectives. The gain control of preamble 12 time T1 16 of FIG. 1 is "coarse" AGC control, which places the signal level in a range level sufficient to recover clock and data reliably. After the short "coarse gain control" time of T1 16, it is possible to further optimize the RMS input level by applying a "fine gain control" during the frame 14 time T2 18 of FIG. 1. In this manner, a very fast gain control algorithm as has been described may be applied to achieve initial gain control during the short interval T1 16, and additional "fine gain control" may occur over the frame time T2 18, which is substantially longer than T1 16. In this manner, the gain control may be determined on a packet-by-packet basis, the gain control comprising a coarse control using the algorithm of FIGS. 5 and 6 over a short interval of time corresponding to T1 16 of FIG. 1, and a fine gain control using any suitable algorithm, including the algorithm of FIGS. 5 and 6 over the remainder of the packet T2 18 of FIG. 1. It is understood by one skilled in the art that the fine gain control which is applied during the T2 18 interval must be done in a slowly varying manner since abrupt changes in gain would introduce non-linear modulation products which interfere with filtering or symbol recovery in detection of the frame 14 during the T2 18 interval. This is a different criterion than is applied during the T1 16 interval, whereby quick settling time is paramount before the frame data 14. In this sense, the gain control is quickly varying during the T1 16 time, and slowly varying during the T2 18 time. It may be desired that the slope (change in gain control divided by change in time) of gain change during the T2 18 fine AGC time is half or less of the slope of gain change during the T1 16 coarse AGC time.

Figure 7:
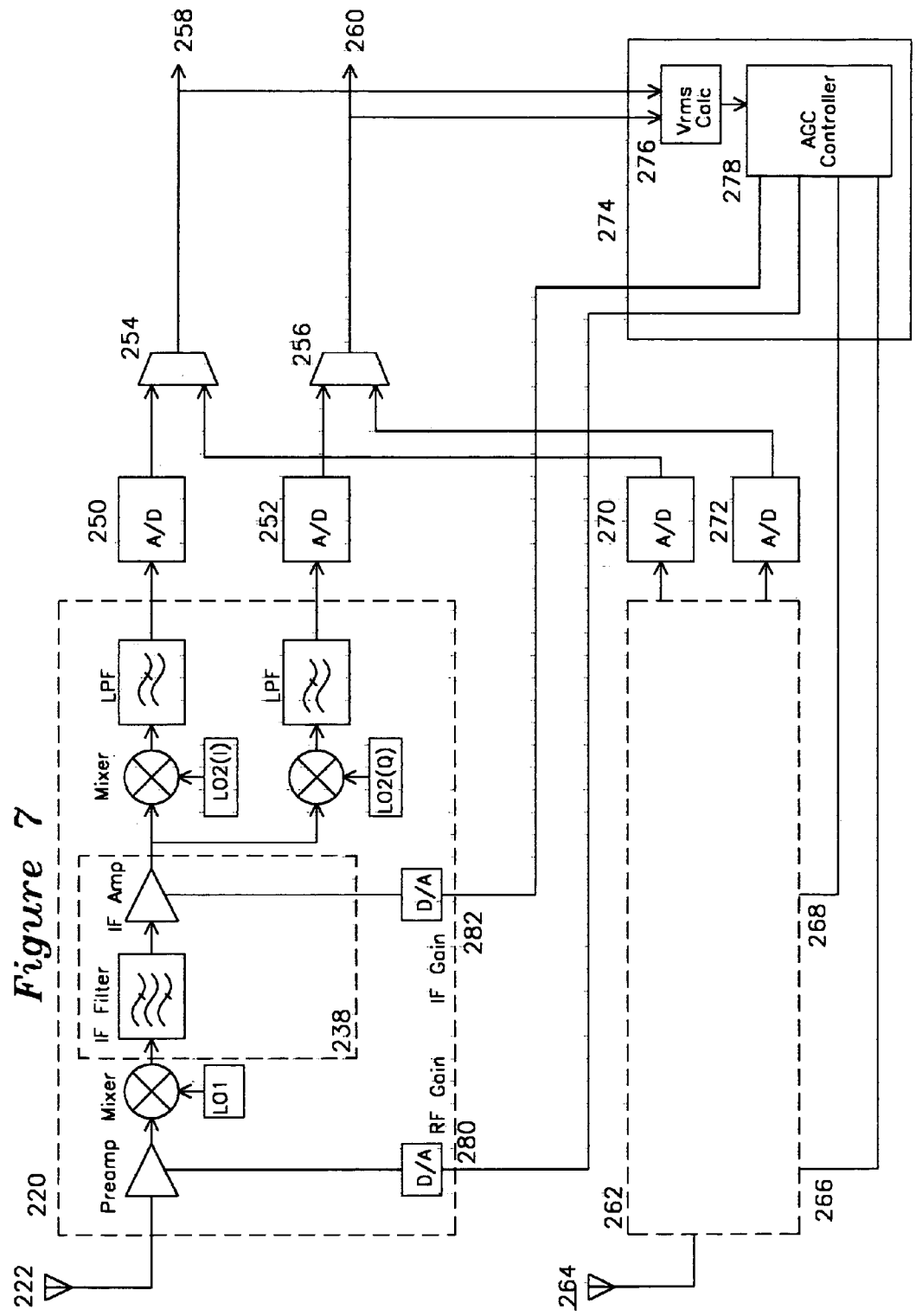
FIG. 7 shows a dual channel digital AGC controller.

FIG. 7 shows another application where a dual-channel wireless front end has two identical RF receivers 220 and 262 coupled to separate antennas 222 and 264. The RF receivers 220 and 262 are identical to the RF receiver described in FIG. 4, and have the same signal processing blocks and functions as were described in FIG. 4. They may be heterodyne RF receivers which include block 238, or they may be direct conversion RF receivers without block 238, as described earlier. Each RF receiver 220 and 262 produce quadrature signals which are sampled by A/D converters 250 and 252 for the first RF receiver and A/D converters 270 and 272 for the second RF receiver 262. These streams of signals are combined by multiplexers 254 and 256 to form a single quadrature stream 258 and 260 of multiplexed data.

Figure 8:
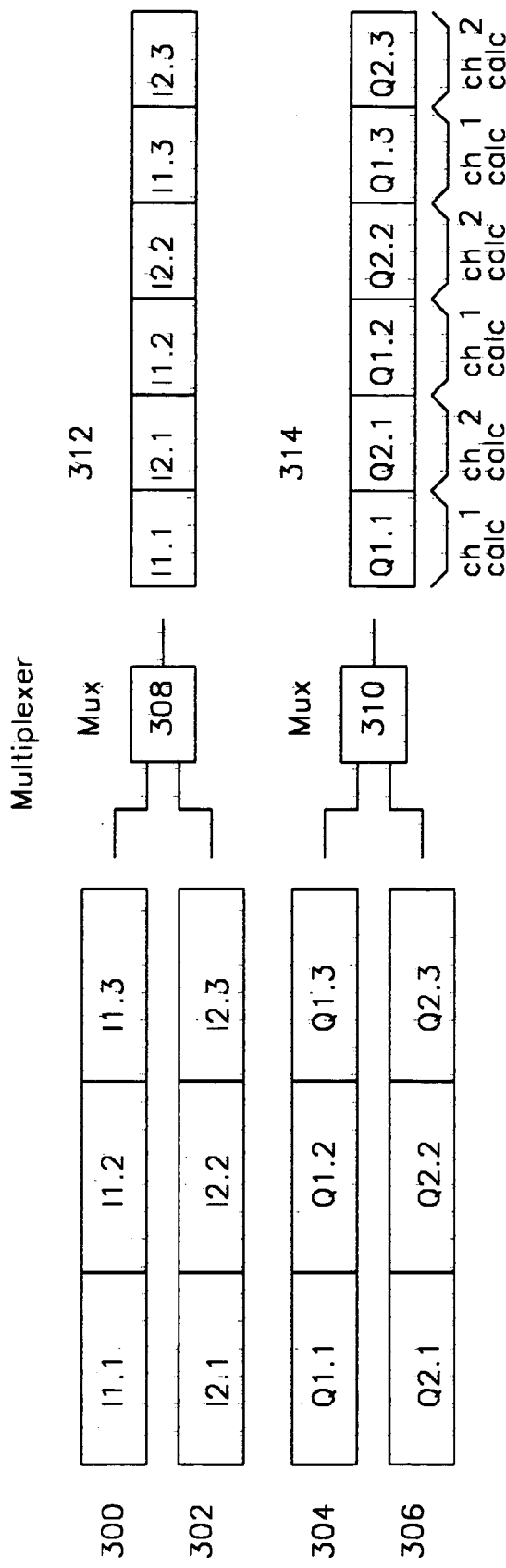
FIG. 8 shows streams of I and Q data from the two RF receivers multiplexing into a single stream of I and Q data.

FIG. 8 shows first channel I data stream 300 as might be produced by A/D converter 250 of FIG. 7 and second channel I data stream 302 as might be produced by A/D converter 270 of FIG. 7 are combined with multiplexer 308 such as multiplexer 254 of FIG. 7 to produce multiplexed I stream 312, which may correspond to multiplexed stream 258 of FIG. 7. First channel Q data stream 304 and second Q data stream 306 are combined in multiplexer 310 to produce multiplexed Q data stream 314, and may correspond to the output streams of A/D converters 252 and 272 combined by multiplexer 256 of FIG. 7. Each I stream 312 and Q stream 314 comprises successive channel 1 and channel 2 sample values, as shown. The multiplexed stream of I and Q signals can be used in alternating fashion by the same gain controller 274 of FIG. 7 to implement the gain control algorithm described in FIG. 5, where each instance of the gain control algorithm is separately maintained for each of the two channels, thereby producing results for each RF receiver 220 and 262 of FIG. 7 separately from the other. Gain control values for first RF receiver 220 are based on results from the computation done on channel 1, and gain control values for second RF receiver 262 are based on results from the computation done on channel 2. In this manner, a single agc control 274 is able to independently control the gain of two separate RF front ends 220 and 262 handling independent streams of packets.

Figure 9:
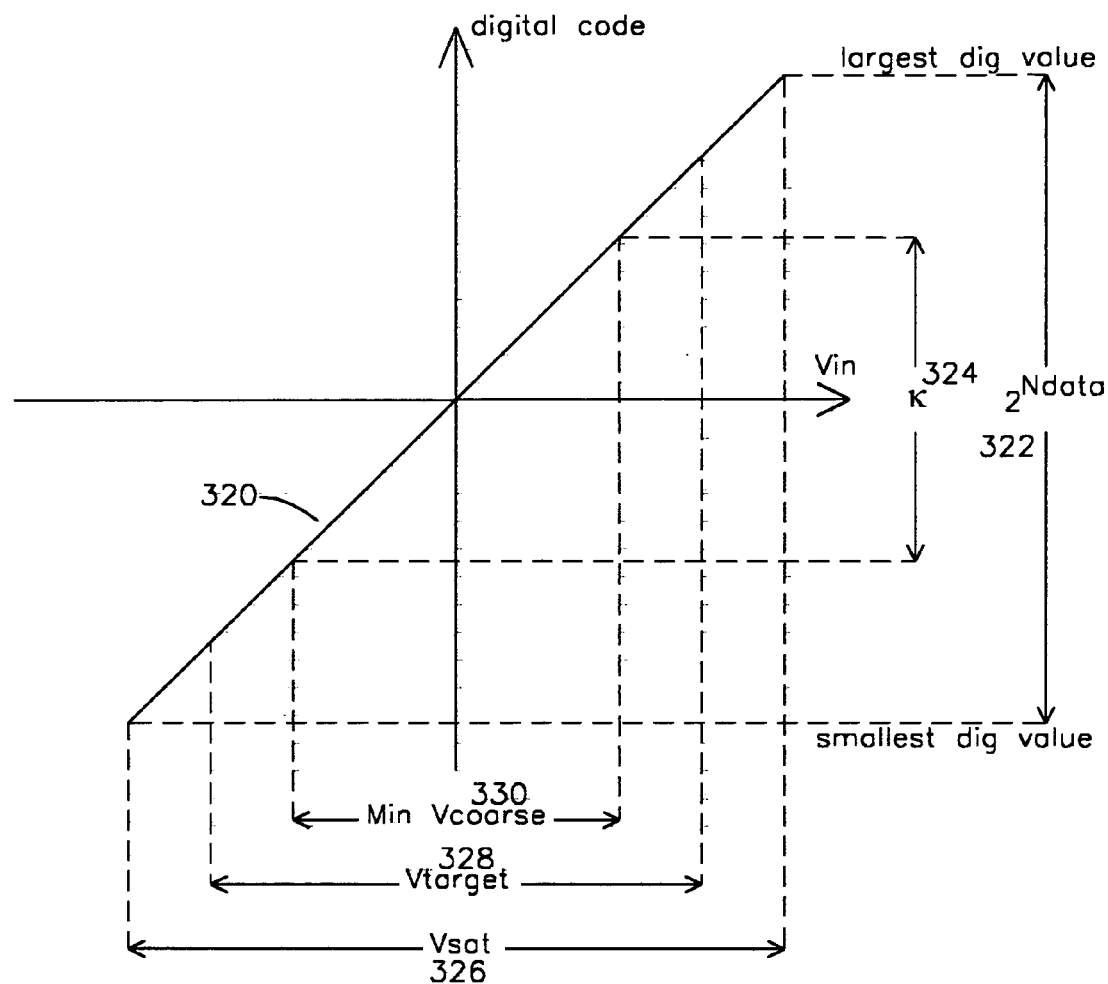
FIG. 9 shows the derivation of Vtarget in the context of a transfer curve.

FIG. 9 shows the relationship 320 between the input voltage to an A/D converter such as 121 and 129 of FIG. 4 and the output code such as 131 and 133 of FIG. 4. The output code is a digital word having a number of bits Ndata for which the maximum number of codes produced by an A/D converter with Ndata bits is $2^{Ndata}$, which corresponds to the input range Vsat 326. The minimum voltage input required to demodulate a received signal with an acceptable error rate is shown as κ 324, corresponding to a minimum input range Min Vcoarse 330. The median of Vsat 326 the largest operable input signal, and Min Vcoarse 330 the minimum operable input signal is Vtarget 328, which is used as Vth of step 166 of FIG. 5.

It is clear to one skilled in the art that the examples given herein are to illustrate, rather than limit, the present invention. For example, the examples shown are for gain control devices which have linear gain characteristics (db gain/gain control is positive and constant). It is clear that many other types of relationships between control words 107 and 115 of FIG. 4 and front end 102 gain may also exist. The algorithm of FIG. 5 is shown for the specific case where increased control 107 or 117 of FIG. 4 produces increasing RF receiver 102 gain, but it is clear to one skilled in the art, and as described earlier in FIG. 5, that the algorithm of FIG. 5 can increase or decrease controls 117 and 107 of FIG. 4 according to what is required to increase or decrease gain according to the result of comparing Vrms to Vth in step 166 of FIG. 5. One such derivation would be to refer to the value added or subtracted a "correction value", and for this "correction value" to be either a positive or negative number. This would enable the same controller to work for either positive gain control or negative gain control. Each iteration of the algorithm of FIG. 5 increments an iteration counter k and adds or subtracts a gain control value which is half of the previous value to achieve gain control. The addition or subtraction is performed according to whether the gain of the amplifier needs to be increased or decreased.

An additional aspect of the invention is the ability to accommodate a large variety of front end RF amplifiers, each of which may have its own characteristics. It is desired to solve for the value Nquick, the number of coarse gain control bits required, which we have earlier called m, the number of iterations. The generalized characteristics for an RF receiver are as follows:

n—Gain Control DAC bitwidth of the RF receiver.

MLG—Maximum Linear Gain: maximum gain change in dB that can be provided by the RF receiver in the linear region of operation.

GO—Gain Offset: The AGC gain control value at which the linear gain control region begins.

RT—Response Time: number of cycles required for the RF amplifier to respond to a unit gain change step provided by one iteration of the gain control algorithm.

a scaling value is provided before the value computed by the AGC controller is output to the RF front end:

GS—Gain Scaling: a gain scaling constant which converts the binary output range of Vagc from the AGC controller to the input AGC range required by the RF Front End.

$N_{binary}$: the number of bits used internally in the controller (shown as n=7 in FIG. 6).

The various factors for optimal use of the agc gain controller may be computed as follows:

$\eta = MLG/(2^{Nbinary}-1)$ which is a characteristic of the RF amplifier, and has the units db/bit From FIG. 9, it can be seen that:

$Vsat/(\text{Min } Vcoarse) = (2^{Ndata}-1)/\kappa$

From FIG. 9, the minimum voltage that can be achieved when trying to reach Max Vtarget is:

Min $Vcoarse = Vtarget*10\hat{}(-2\eta 2^{\delta-1}/20)$ where ˆ is the exponent operator.
solving for δ yields $\delta = [\log_2(10*\log_{10}(Vsat/\text{Min } Vcoarse)/\eta)+1]$ where the [.] operator denotes the smallest integer value (commonly known as the mod( ) function).

The following example illustrates the use of these parameters in designing a specific AGC controller:

for:

Ndata=6 bits (the bitwidth of the outputs of the A/D converters)

n=7 bits (the bitwidth of the gain control DAC)

Nbinary=7 (number of binary search bits in the AGC controller)

η=dB/step gain control of the RF receiver

κ=16, which is the number of quantization steps required for the processing after the quadrature A/D converters.

$\delta = [\log_2(10*\log_{10}(Vsat/\text{Min Vcoarse})/\kappa\eta)+1]$ and substituting for Vsat/Mvcoarse from above produces $\delta = [\log_2(10*\log_{10}((2^{Ndata}-1)/\kappa\eta)+1] = 4$ from the earlier values.

Nquick is the number of coarse bits, also representing the number of iterations m, and can be found from:

Nquick=m=Nbinary−δ solving for this example, Nquick=m=7−4=3 which produces the design result that the number of iterations m=3.

The second generalization of the design equations for an arbitrary RF receiver is the adaptation of the step 168 and step 170 of FIG. 5. The generalized adjustment value $2^{(n-k-1)}$ may be referred to as the Gain_Binary. As is well known to one skilled in the prior art of amplifiers and gain control, it may be desired to accommodate the amplifier gain characteristic and offset characteristics in Vagc that is applied to the amplifier. For the generalized case, the equations shown in steps 168 and 170 of FIG. 5 may be changed to:

step 168:

$Vagc = GO + GS*2^{(n-k-1)}$ step 170:

$Vagc = GO - GS*2^{(n-k-1)}$ where GO=the gain offset described above, and GS=the gain scaling described above, which includes the effect of positive gain response or negative gain response, as described in FIG. 3. The effect of GO in Vagc is to cancel the intrinsic gain offset present in the amplifier, and GS scales the range of binary value where k=0 of $2^{(n-1)}$ to match the binary control input of the RF amplifier.

We claim:
1. A digital gain control system comprising:
an rms voltage converter receiving one or more digital inputs and forming an rms value; and
a digital gain controller including:
an iteration variable set to an initial value;

a digital gain value having n data bits, said digital gain value having a maximum value and a minimum value, the initial digital gain value being set to the median of said maximum value and said minimum value;

a correction value having an initial value which is half of said initial digital gain value;

an iteration controller which performs the following sequential steps m times, said m being an integer less than said n:

comparing the rms value from said rms voltage converter to a threshold voltage value;

adding said correction value to said digital gain value if said rms value is less than said threshold voltage value, or subtracting said correction value from said digital gain value if said rms value is greater than said threshold voltage value;

forming a new correction value for a subsequent iteration by halving said correction value.

2. The digital gain control system of claim 1 wherein said m is a system constant derived from:

Nbinary, the number of search bits;

η, the dB/step gain of a receiver to be controlled by said digital gain value;

Ndata, the bitwidth of the output of an A/D converter sampling a signal amplified by a variable gain amplifier, said variable gain controlled by said digital gain value;

κ, the number of A/D converters quantization steps required for digital signal processing.

3. The digital gain control system of claim 2 wherein said m is computed from:

$$m = N\text{binary} - [\log_2(10 * \log_{10}((2^{Ndata}-1)/\kappa\eta)+1],$$

and the operator [.] rounds down to an integer value.

4. The digital gain control system of claim 1 wherein said correction value is $2^{(n-k-1)}$ and said k is the number of times said iteration has been performed.

5. The digital gain control system of claim 1 wherein said correction value is positive.

6. The digital gain control system of claim 1 wherein said correction value is negative.

7. The digital gain control system of claim 1 wherein said iteration controller operates over a duration of time substantially equal to the duration of a received packet, said packet including a first interval and a second interval, the time duration between at least one said iteration during said first interval being less than the time duration between at least one said iteration during said second interval.

8. The digital gain control system of claim 7 wherein said first interval corresponds to a preamble interval of a wireless Ethernet packet.

9. The digital gain control system of claim 7 wherein said second interval corresponds to a payload interval following said first interval in a wireless Ethernet packet.

10. The process of claim 1 wherein said m is one of the values 3, 4, or 5.

11. A process for generating a value Vagc where said Vagc is a digital value having n bits and operative for controlling the gain of a processor which produces one or more channels of digital samples, said process comprising:

setting Vagc to an initial value;

setting Vcorrection to a value substantially equal to half of said Vagc initial value; and performing the following first through fourth steps m iterations in sequence:

a first step of measuring said digital samples;

a second step of converting said digital samples into an rms value;

a third step of comparing said rms value with a threshold value and adding said Vcorrection to said Vagc if said rms value is less than said threshold value, and subtracting said Vcorrection from said Vagc if said rms value is greater than said threshold value;

a fourth step of forming a new value of said Vcorrection by halving the value of said Vcorrection.

12. The process of claim 11 wherein said m is a system constant derived from:

Nbinary, the number of search bits;

η, the dB/step gain of a receiver to be controlled by said digital gain value;

Ndata, the bitwidth of the output of an A/D converter sampling a signal amplified by a variable gain amplifier, said variable gain controlled by said digital gain value;

κ, the number of A/D converter quantization steps required for digital signal processing.

13. The process of claim 12 wherein said m is one of the values 3, 4, or 5.

14. The process of claim 12 whereby said m is computed from:

$$m = N\text{binary} - [\log_2(10 * \log_{10}((2^{Ndata}-1)/\kappa\eta)+1]$$

and the operator [.] rounds down to an integer value.

15. The process of claim 11 wherein said Vagc has a maximum value of $2^n - 1$.

16. The process of claim 11 wherein said gain correction value is $2^{(n-k-1)}$, and k is the number of the iteration, starting at 1 and incrementing by 1 for each said iteration.

17. The process of claim 11 wherein said Vcorrection value is positive.

18. The process of claim 11 wherein said Vcorrection value is negative.

19. The process of claim 11 wherein said first through fourth steps comprise an iteration time wherein the iteration time during a first interval is shorter than the iteration time during a second interval and wherein the second interval follows said first interval.

20. The process of claim 19 wherein said first interval corresponds to a preamble time T1 of a wireless Ethernet packet.

21. The process of claim 19 wherein said second interval corresponds to a frame time following the preamble time of a wireless Ethernet packet.

22. The process of claim 11 wherein said m iterations occurs during a preamble time of a wireless Ethernet packet.

23. An RF front end comprising:

an RF receiver responsive to a digital gain control input of width n bits, said RF receiver producing quadrature output digital values; and a digital gain controller coupled to said digital gain control input and producing a digital output Vagc coupled to said digital gain control input in response to said quadrature output digital values, said output Vagc generated by:

setting Vagc to an initial value $2^{(n-1)} - 1$ and setting an iteration variable k to 0;

performing the following first through fourth steps while said k is less than m, where said m is an integer less than said n:

a first step of measuring said quadrature output digital values and producing the rms value of said quadrature output digital values;

a second step of comparing said rms value to a threshold value;
a third step of incrementing said k;
a fourth step of adding a correction value $2^{(n-k-1)}$ to said Vagc if said rms value is less than said threshold value, and subtracting a correction value $2^{(n-k-1)}$ from said Vagc if said rms value is greater than said threshold value.

24. The RF front end of claim 23 wherein said m is a system constant derived from:
Nbinary, the number of search bits;
η, the dB/step gain of a receiver to be controlled by said digital gain value;
Ndata, the bitwidth of the output of an A/D converter sampling a signal amplified by a variable gain amplifier, said variable gain controlled by said digital gain value;
κ, the number of A/D converters quantization steps required for digital signal processing.

25. The process of claim 24 wherein said m is one of the values 3, 4, or 5.

26. The process of claim 24 whereby said m is computed from:
$m = Nbinary - [\log_2(10*\log_{10}((2^{Ndata}-1)/\kappa\eta)+1]$ and the operator [.] rounds down to an integer value.

27. The RF front end of claim 23 wherein said correction value is positive.

28. The RF front end of claim 23 wherein said correction value is negative.

29. The RF front end of claim 23 wherein said first through fourth steps comprise an iteration time wherein the iteration time during a first interval is shorter than the iteration time during a second interval and wherein the second interval follows said first interval.

30. The RF front end of claim 29 wherein said first interval corresponds to a preamble time of a wireless Ethernet packet.

31. The RF front end of claim 29 wherein said second interval corresponds to a frame time following the preamble time of a wireless Ethernet packet.

32. The RF front end of claim 23 wherein said first through fourth steps occur during a preamble time of a wireless Ethernet packet.

33. A digital gain control system for a first and second stream of quadrature data, said first and said second stream of quadrature data multiplexed into a single alternating stream of data having an associated first stream interval and a second stream interval, the digital gain control system operative on said single stream of data and computing a gain control value for each said first and said second stream of quadrature data said digital gain control system including:
an rms voltage converter receiving one or more values from said single stream of data and forming an rms value; and
a digital gain controller including:
an iteration variable associated with each said stream of data, each said iteration variable set to an initial value;
a digital gain value for each said stream of data, each said digital gain value having n bits, said digital gain value having a maximum value and a minimum value, each said digital gain value being initially set to the median of said maximum value and said minimum value;
a correction value associated with each said stream of data, each said correction value having an initial value which is substantially half of the initial digital gain value associated with a corresponding said stream of data;
an iteration process which performs the following sequential steps m times for each said stream of data:
comparing the rms value from said rms voltage converter for a particular stream of data to a threshold voltage value associated with said particular stream of data;
adding said correction value associated with said particular stream of data to said digital gain value if said rms value is less than said threshold voltage level associated with said particular stream of data, or subtracting said correction value associated with said particular stream of data from said digital gain value if said rms value is greater than said threshold voltage level associated with said particular stream of data;
forming a new correction value associated with said particular stream of data by halving said correction value associated with said particular stream of data;
whereby said digital gain control systems computes said first gain control value using only values from said first stream of data and computes said second gain control value using only values from said second stream of data.

34. The system of claim 33 wherein the iteration time for a particular said stream of data during a first interval is shorter than the iteration time during a second interval for said particular stream of data and wherein the second interval follows said first interval.

35. The system of claim 34 where said first interval corresponds to a preamble time of a wireless Ethernet packet.

36. The system of claim 34 where said second interval corresponds to a frame time following the preamble time of a wireless Ethernet packet.

37. The system of claim 33 where said m times occurs during a preamble time of a wireless Ethernet packet.

38. An RF front end comprising:
a first RF receiver having a digital gain control input of width n and producing a first quadrature output digital value including a first I value and a first Q value;
a second RF receiver having a digital gain control input of width n bits and producing a second quadrature output digital value including a second I value and a second Q value;
a multiplexer converting said first I value and said second I value into a stream of alternating first and second I values, and also converting said first Q value and said second Q value into a stream of alternating first and second Q values; and
a digital gain controller coupled to said stream of alternating I values and said stream of alternating Q values and producing a first output Vagc and a second output Vagc, respectively, each of said first Vagc and said second Vagc independently generated by:
setting Vagc to an initial value $2^{(n-1)}-1$, where n is said bit width, and setting an iteration variable k to 0;
performing the following steps while said k is less than said m:
a first step of measuring said quadrature digital values and producing the rms value of said quadrature digital values;
a second step of comparing said rms value to a threshold value;
a third step of incrementing said k; and a fourth step of adding a correction value $2^{(n-k-1)}$ to said Vagc if said rms value is less than said threshold value, and subtracting the correction value $2^{(n-k-1)}$ from said Vagc if said rms value is greater than said threshold value.

39. The RF front end of claim 38 wherein said first through fourth steps comprise an iteration time wherein the iteration time during a first interval is shorter than the iteration time during a second interval and wherein the second interval follows said first interval.

40. The RF front end of claim 39 wherein said first interval corresponds to a preamble time of a wireless Ethernet packet.

41. The RF front end of claim 39 wherein said second interval corresponds to a frame time following the preamble time of a wireless Ethernet packet.

42. The RF front end of claim 39 wherein said first through fourth steps occur during a preamble time of a wireless Ethernet packet.

43. A process for generating a first value Vagc and a second value Vagc from an alternating stream of first quadrature data and second quadrature data, where said first Vagc is derived exclusively from said first quadrature data and said second Vagc is derived exclusively from said second quadrature data, where each of said first Vagc and said second Vagc are each digital values having n bits, said process comprising for each said first and second Vagc:

setting Vagc to a first value; and setting Vcorrection to a value equal to substantially half of said Vagc first value;

performing the following steps m times in sequence:

measuring one or more said quadrature data samples and converting said quadrature data samples into an rms value;

comparing said rms value with a threshold value and adding said Vcorrection to said Vagc if said rms value is less than said threshold value, and subtracting said Vcorrection from said Vagc if said rms value is greater than said threshold value;

forming a new value of said Vcorrection by halving the value of said Vcorrection.

44. The process of claim 43 wherein said first through fourth steps have an iteration time wherein the iteration time during a first interval is shorter than the iteration time during a second interval and wherein the second interval follows said first interval.

45. The process of claim 43 wherein said first interval corresponds to a preamble time of a wireless Ethernet packet.

46. The process of claim 43 wherein said second interval corresponds to a frame time following the preamble time of a wireless Ethernet packet.

47. The process of claim 43 wherein said m times occurs during a preamble time of a wireless Ethernet packet.

* * * * *

UNITED STATES PATENT AND TRADEMARK OFFICE
CERTIFICATE OF CORRECTION

PATENT NO. : 7,386,074 B1
APPLICATION NO. : 10/680620
DATED : June 10, 2008
INVENTOR(S) : Narasimhan Venkatesh et al.

It is certified that error appears in the above-identified patent and that said Letters Patent is hereby corrected as shown below:

Column 8, line 7 "$(2^{Ndata}=1)$" should be changed to --$(2^{Ndata}-1)$--

Column 8, line 28 "$\delta=[\log_2(10*\log_{10}((Vsat/Min\ VCoarse)/\kappa\eta)+1]$" should be changed to --$\delta=[\log_2(10*\log_{10}((Vsat/Min\ Vcoarse)/\eta)+1]$--

Signed and Sealed this

Eighth Day of September, 2009

David J. Kappos
*Director of the United States Patent and Trademark Office*